(12) United States Patent
Higashi

(10) Patent No.: US 6,686,224 B2
(45) Date of Patent: Feb. 3, 2004

(54) CHIP MANUFACTURING METHOD FOR CUTTING TEST PADS FROM INTEGRATED CIRCUITS BY SECTIONING CIRCUIT CHIPS FROM CIRCUIT SUBSTRATE

(75) Inventor: Kunihiko Higashi, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 10/208,496

(22) Filed: Jul. 30, 2002

(65) Prior Publication Data

US 2003/0049871 A1 Mar. 13, 2003

(30) Foreign Application Priority Data

Sep. 13, 2001 (JP) ........................................ 2001-277877

(51) Int. Cl.7 .......................... H01L 21/44; H01L 21/46; H01L 21/66
(52) U.S. Cl. ........................................ 438/113; 438/462
(58) Field of Search ............................ 438/14, 113, 460, 438/422; 700/117, 118

(56) References Cited

U.S. PATENT DOCUMENTS 5,059,899 A  * 10/1991  Farnworth et al. .......... 324/158
5,981,971 A  * 11/1999  Miyakawa .................... 257/48

FOREIGN PATENT DOCUMENTS

| JP | 62199026 | | 9/1987 | |
| JP | 62207970 | | 9/1987 | |
| JP | 02211648 | * | 8/1990 | ........... H01L/21/66 |
| JP | 03022456 | | 1/1991 | |
| JP | 06244252 | | 9/1994 | |
| JP | 10256324 | * | 9/1998 | ........... H01L/21/66 |

OTHER PUBLICATIONS

Timothy Turner Practical issues in the Probing of Copper Pads Solid State Technology Mar. 2001 pp. 97–97–98,100, 102.*

* cited by examiner

*Primary Examiner*—Craig A. Thompson
*Assistant Examiner*—David S Blum
(74) *Attorney, Agent, or Firm*—Katten Muchin Zavis Rosenman

(57) ABSTRACT

A chip manufacturing method sets a first and a second section lines in parallel to each other along one side of each rectangular integrated circuit formed on a circuit substrate, and forms test wirings and test pads in gaps between the first and second section lines. After the circuit substrate is sectioned along the outer first section lines, a circuit test is conducted on resulting integrated circuits. After the circuit test is completed, a portion outside the second section line is cut away from each circuit chip. The test pads remain on circuit chips which are to undergo a circuit test, whereas no test pads remain on finished circuit chips which are to be shipped. It is therefore possible to prevent a user from fraudulently accessing the integrated circuit through the test pads of the circuit chip.

9 Claims, 6 Drawing Sheets

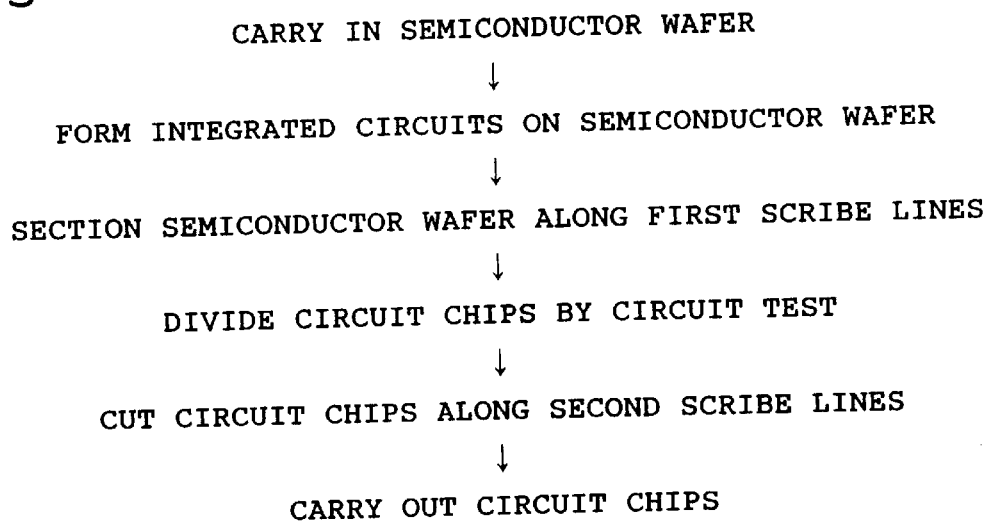
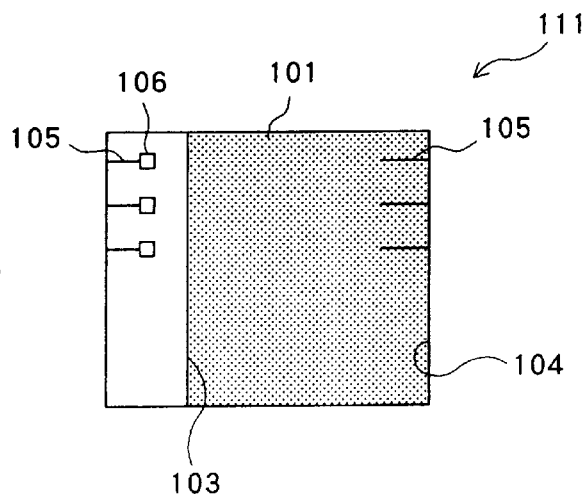

CHIP MANUFACTURING METHOD FOR CUTTING TEST PADS FROM INTEGRATED CIRCUITS BY SECTIONING CIRCUIT CHIPS FROM CIRCUIT SUBSTRATE

BACKGROUND OF THE INVENTION

1. Field of the Invention

The present invention relates to a chip manufacturing method for manufacturing circuit chips from a circuit substrate, and more particularly, to a chip manufacturing method for manufacturing circuit chips with which a circuit test through test pads is performed.

2. Description of the Related Art

At present, circuit chips comprising integrated circuits are used in a variety of electronic apparatus, and a variety of methods also exist for manufacturing and testing such circuit chips. A typical chip manufacturing method involves forming a large number of rectangular integrated circuits in an array on the surface of a silicon wafer, which serves as circuit substrates of resulting integrated circuits, through scribing lines, and sectioning the silicon wafer along the scribing lines by scribing or dicing to form a large number of circuit chips, each of which comprises the integrated circuit.

When circuit chips are manufactured in the foregoing manner, integrated circuits may be additionally formed with test wirings and test pads for testing the integrated circuits. In this event, the test pads have been connected to associated parts through the test wirings when the integrated circuits are formed, and, for example, the silicon wafer is sectioned to form circuit chips before a tester is connected to the test pads for testing the integrated circuit in each circuit chip.

In another technique, a tester is connected to test pads of integrated circuits formed on a silicon wafer for testing the integrated circuits, and the silicon wafer is sectioned to form circuit chips after the circuit test is completed. In such a technique which tests the integrated circuits before the silicon wafer is sectioned, test pads are not required for the circuit chips sectioned from the silicon wafer.

On the other hand, when a silicon wafer is sectioned along scribe lines by dicing or the like, the scribe lines must have a predetermined width. Japanese Patent examined Publications Nos. 07-120696B(62199026A), 08-030820B (62207970A) and 08-008288B(06244252A), Japanese examined Patent No. 03093216B(03022456A), and the like disclose techniques which eliminate test pads that would otherwise remain on circuit chips by forming the test pads on scribe lines which are defined as scribe regions.

In such a circuit chip, since test pads are formed in the scribe region used for sectioning a silicon wafer, no test pads exist on a sectioned circuit chip. It is therefore possible to reduce the size of the circuit chip, and prevent a malicious user from fraudulently accessing an integrated circuit in the circuit chip through test pads.

In recent years, however, due to an improved accuracy of scribing and dicing, and increasingly narrower scribe lines, it becomes increasingly difficult to form test pads on the scribe lines used as a scribe region.

While test pads can be formed in scribe regions in the aforementioned technique of sectioning a silicon wafer after integrated circuits are tested, test pads cannot be formed in scribe regions in a technique which sections a silicon wafer before integrated circuits are tested.

SUMMARY OF THE INVENTION

It is an object of the present invention to provide a chip manufacturing method which is capable of preventing fraudulent accesses to circuit chips even with a technique which sections a silicon wafer along highly accurate and narrow scribe lines before integrated circuits are tested.

A first chip manufacturing method according to the present invention, similar to the prior art, forms a number of substantially rectangular integrated circuits, each connected to at least one test pad through a test wiring, arranged through section lines on the surface of a circuit substrate, sections the circuit substrate along the section lines into the individual integrated circuits to form a number of circuit chips, and conducts a circuit test through the test pads associated with the circuit chips.

Specifically, a first and a second section lines are set in parallel to each other along at least one of four sides of each of the substantially rectangular integrated circuit arranged and formed on the surface of the circuit substrate, and the test pads and/or at least part of each of the test wirings are formed in gaps between the first and second section lines.

The circuit test is conducted after sectioning the circuit substrate along the first section line positioned outside, and each circuit chip is cut along the second section line after conducting the circuit test to remove from the circuit chip a portion thereof in which the test pad and/or at least the part of the test wiring are formed.

Since the test pads connected to integrated circuits through the test wirings remain on the circuit chips when they are sectioned individually from the circuit substrate, the circuit test can be simply and satisfactorily conducted on the integrated circuits through the test pads.

On the other hand, since the test pads connected to the integrated circuits through the test wirings do not remain when the circuit chips are shipped after the circuit test is completed, it is possible to securely prevent fraudulent accesses to the integrated circuits through the test pads.

In a second chip manufacturing method according to the present invention, integrated circuits of circuit chips which undergo a circuit test are cut from a circuit substrate along first section lines positioned outside, while integrated circuits of circuit chips which do not undergo a circuit test are cut from the circuit substrate along second section lines positioned inside.

Thus, the test pads remain on circuit chips which undergo the circuit test before shipment, so that the integrated circuits can be simply and satisfactorily tested through the test pads. On the other hand, there is no test pad which would be connected to the integrated circuits through the test wirings on circuit chips, which are shipped without the circuit test conducted thereon, so that it is possible to securely prevent fraudulent accesses to the integrated circuits through the test pads.

In a third chip manufacturing method according to the present invention, similar to the prior art, a circuit test is conducted on at least some of integrated circuits formed on a circuit substrate through test pads, and the circuit substrate is sectioned along section lines into individual integrated circuits, after the circuit test is completed, to form a number of circuit chips. After the circuit test is completed, the circuit substrate is sectioned along at least second section lines positioned inside.

Thus, since the test pads connected to the integrated circuits through the test wirings remain on the circuit chips at the time the circuit test is conducted thereon, the integrated circuits can be simply and satisfactorily tested through the test pads. On the other hand, the test pads connected to the integrated circuits through the test wirings do not remain on the circuit chips when they are shipped after the circuit test is completed, so that it is possible to securely prevent fraudulent accesses to the integrated circuits through the test pads.

As another aspect of the present invention, the test pad is formed in a gap between the first and second section lines, and the test wiring connects the integrated circuit positioned inside the second section line to the test pads positioned outside the second section line.

Therefore, as a portion outside the second section line is cut away from the circuit chip, no test pad remains on the circuit chip, so that fraudulent accesses can be prevented without fail.

Alternatively, the test pad is formed within the integrated circuit which is positioned inside the second section line, and a portion of the test wiring connecting the integrated circuit to the test pad, both positioned inside the second section line, is routed in a gap between the first and second section lines.

Therefore, as a portion outside the second section line is cut away from the circuit chip, the test wiring connecting the integrated circuit to the test pad is cut, so that fraudulent accesses can be prevented in a satisfactory manner.

The above and other objects, features and advantages of the present invention will become apparent from the following description with reference to the accompanying drawings which illustrate examples of the present invention.

BRIEF DESCRIPTION OF THE DRAWINGS

FIG. 3 is a schematic flow chart illustrating the chip manufacturing method;

FIG. 4 is a top plan view illustrating a first exemplary modification to a circuit chip;

DETAILED DESCRIPTION OF THE PREFERRED EMBODIMENTS

Figure 1:
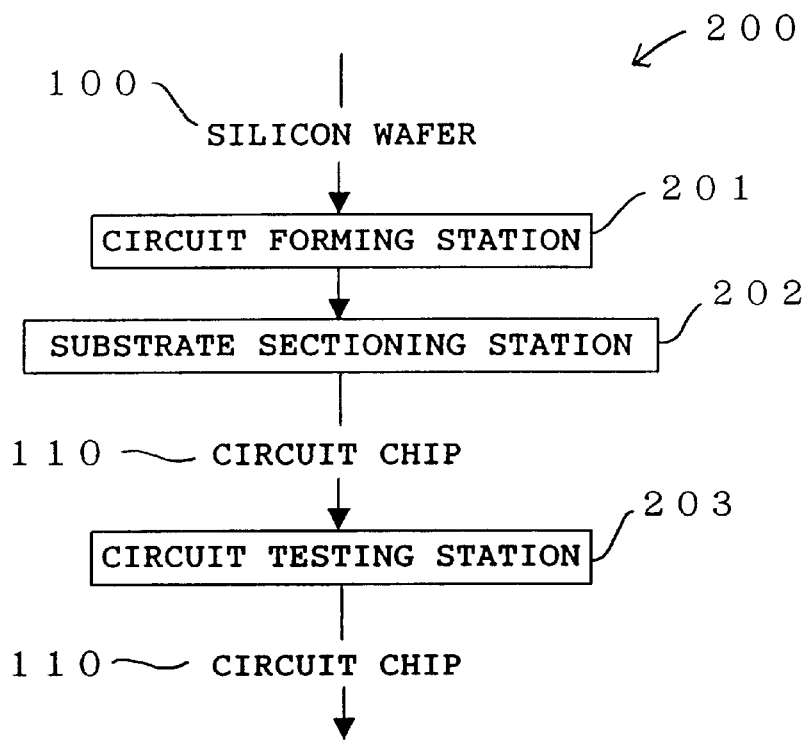
FIG. 1 is a block diagram illustrating a chip manufacturing system in one embodiment of the present invention.

One embodiment of the present invention will be described below with reference to the accompanying drawings. First, as illustrated in FIG. 1, chip manufacturing system 200 in this embodiment is identical in hardware configuration to the prior art, and has circuit forming station 201, substrate sectioning station 202, and circuit testing station 203. Chip manufacturing system 200, however, differs from the prior art in details of operations performed by these stations.

Figure 2A:
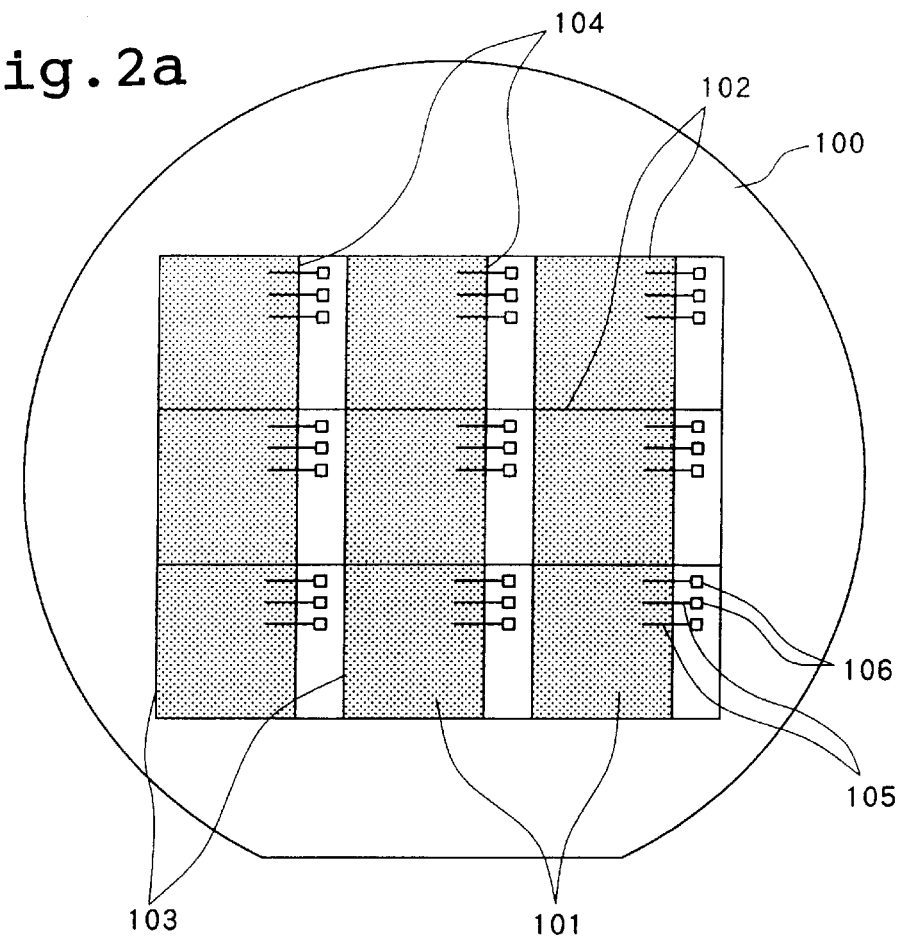
FIGS. 2a–2c are process diagrams illustrating a chip manufacturing method in one embodiment of the present invention.

Circuit forming station 201 comprises a wafer carry-in mechanism, a sputtering apparatus, a CVD (Chemical Vapor Deposition) apparatus, and the like for forming a large number of rectangular integrated circuits 101 on the surface of silicon wafer 100 which serves as circuit substrates of resulting integrated circuits, as illustrated in FIG. 2a.

A large number of integrated circuits 101 are arranged through scribe lines 102–104 along which silicon wafer 100 is sectioned. First and second scribe lines 103, 104 are set in parallel on the right side of the integrated circuits 101 in FIG. 2a.

Then, a large number of integrated circuits 101 have their predetermined parts connected to a plurality of test pads 106, respectively, through a plurality of test wirings 105. These test pads 106 are formed in gaps between first and second scribe lines 103, 104, and test wirings 105 straddle second scribe lines 104.

Figure 2B:
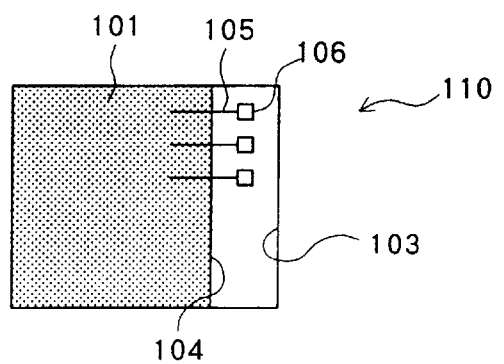

Substrate sectioning station 202 comprises a wafer conveying mechanism, a scribing apparatus, a dicing apparatus, and the like, and sections silicon wafer 100, on which integrated circuits 101 have been formed in the aforementioned circuit forming station 201, along scribe lines 102 in a front-to-back direction (from top-to-down in the plane of the drawing) and along first scribe lines 103, positioned outside, in a left-to-right direction before performing a circuit test, described later, to form partially finished circuit chips 110, as illustrated in FIG. 2b.

Circuit testing station 203 comprises a circuit tester, a wafer partitioning mechanism, and the like, and performs a variety of circuit tests on integrated circuits 101 by electrically connecting test terminals to test pads 106 on partially finished circuit chips 110 formed by the aforementioned substrate sectioning station 202.

Figure 2C:
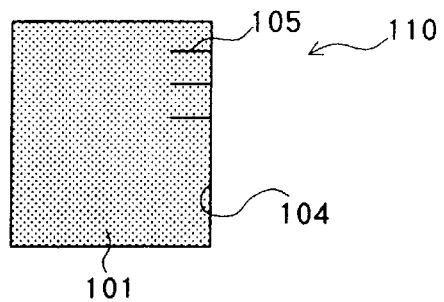

After performing the circuit tests, the aforementioned substrate sectioning station 202 sections circuit chips 110 along second scribe lines 104 to remove portions which include test pads 106 and portions of test wirings 105 to complete circuit chips 110 as illustrated in FIG. 2c.

Circuit chips 110 thus completed in this embodiment are each formed with integrated circuit 101 on the surface of sectioned silicon wafer 100, and test wirings 105 are connected to associated parts of integrated circuit 101. Test wirings 105, however, are sectioned at the position of second scribe line 104.

In the structure as described above, a chip manufacturing method based on chip manufacturing system 200 in this embodiment forms a large number of rectangular integrated circuits 101 on the surface of silicon wafer 100 through scribe lines 102–104, as shown in FIG. 3, where first and second scribe lines 103, 104 are set in parallel on the right side of integrated circuits 101 in the figure, as illustrated in FIG. 2a.

In this event, a large number of integrated circuits 101 formed on silicon wafer 100 have predetermined parts connected to a plurality of test pads 106, respectively, through a plurality of test wirings 105. These test pads 106 are formed in gaps between first and second scribe lines 103, 104, and test wirings 105 straddle first scribe lines 103.

As the formation of circuits is completed, silicon wafer 100 is sectioned along scribe lines 102 in the front-to-back direction, and also sectioned along scribe lines 103 in the left-to-right direction, so that partially finished circuit chip 110 is formed for each integrated circuit 101.

In circuit chip 110 thus formed, a plurality of test pads 106 are positioned to the right of integrated circuit 101 through second scribe line 104, as illustrated in FIG. 2b, and each of test pads 106 is individually connected to an associated part of integrated circuit 101 through one of a plurality of test wirings 105 which straddle second scribe line 104. Thus, a circuit test is conducted on this integrated circuit 101 through test pads 106.

Circuit chip 110 determined as non-defective in the circuit test is sectioned along second scribe line 104, so that the portion in which test pads 106 and portions of test wirings 105 are positioned is cut from circuit chip 110, as illustrated in FIG. 2c.

Circuit chip 110 thus completed is encapsulated, for example, in a resin package after lead terminals are bonded to associated parts, and used in an electronic apparatus as a part mounted therein.

Circuit chip 110 in this embodiment, manufactured in the manner described above, has dedicated test pads 106 after silicon wafer 100 is sectioned into individual integrated circuits 101, as illustrated in FIG. 2b, so that a circuit test can be readily conducted on integrated circuit 101 through test pads 106.

In finished circuit chip 110 which is shipped as a product, on the other hand, test wirings 105 are connected to associated parts of integrated circuit 101 as illustrated in FIG. 2c. However, test wirings 105 are cut at the position of second scribe line 104, so that it is possible to satisfactorily prevent a malicious user from fraudulently accessing integrated circuit 101 through test pads 106.

Moreover, in the chip manufacturing method of this embodiment, first and second scribe lines 103, 104 are set in parallel to each other along one side of integrated circuit 101, and test pads 106 are formed in a gap between first and second scribe lines 103, 104, so that a circuit test can be conducted on circuit chips 110 after they have been sectioned, unlike the prior art disclosed in Japanese Patent examined Publications Nos. 07-120696B, 08-030820B, and 08-008288B, Japanese Patent No. 03093216B, and the like. In addition, test pads 106 can be removed from finished circuit chip 110 even if scribe lines 103, 104 are accurately drawn in a narrow width.

It should be understood the present invention is not limited to the foregoing embodiment, but various modifications can be permitted without departing from the spirit and scope of the invention. For example, while the foregoing embodiment has illustrated that circuit chips 110 sectioned from silicon wafer 100 are shipped after all circuit chips 110 have been tested, all circuit chips 110 may be shipped after some of them have been tested.

It is also possible to section circuit chips 110 into those for testing and those for shipping, or, to test circuit chips 110 on a silicon wafer 100 without shipment and to ship circuit chips 110 on another silicon wafer 100 without testing, and so on.

However, in these cases, test pads 106 remaining on circuit chips 110, which are not shipped, would not give rise to any problem, so that it is possible to maintain circuit chips 110 in the state illustrated in FIG. 2b, and to omit to section circuit chips 110 along second scribe lines 104. Also, as illustrated in FIG. 4, test pads 106 are essentially useless for circuit chips 111 which are shipped, so that it is possible to omit to section circuit chips 110 along first scribe lines 103.

Further, the foregoing embodiment has illustrated that circuit chips 110 are sectioned from silicon wafer 100 before integrated circuits 101 are tested. Alternatively, integrated circuits 101 can be tested, for example, when they are formed on silicon wafer 100.

In this case, since silicon wafer 100 is sectioned after integrated circuits 101 have been tested, circuit chips 111 can be formed without sectioning them along first scribe lines 103, as illustrated in FIG. 4.

Also, while the foregoing embodiment has illustrated that nine integrated circuits 101 are arranged in three rows and three columns on the surface of silicon wafer 100, it should be understood that the number of integrated circuit 101 and their arrangement can be set in various manners as desired.

Similarly, while the foregoing embodiment has illustrated that each integrated circuit 101 is formed with three test wirings 105 and test pads 106, the number of test wirings 105 and test pads 106 can also be set in various manners.

Figure 5A:
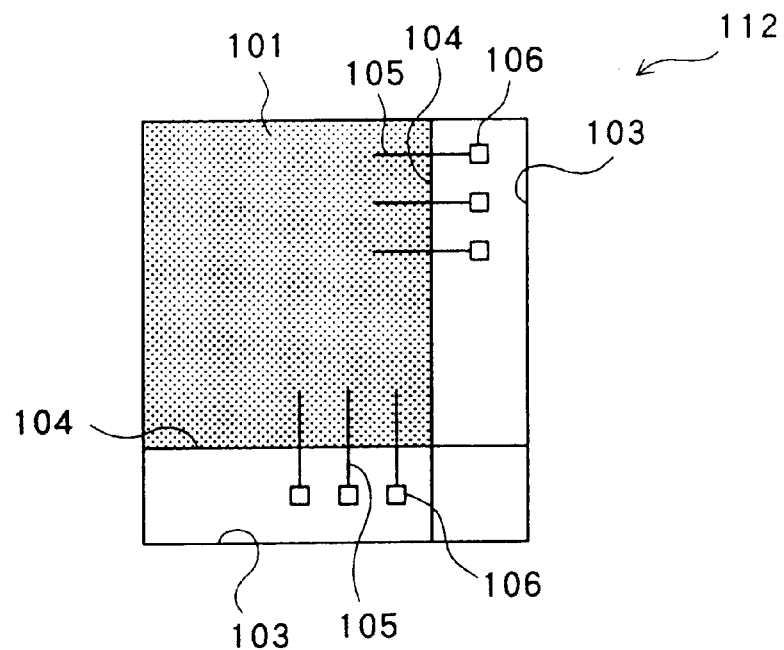
FIGS. 5a and 5b are top plan views illustrating a second exemplary modification.
Figure 5B:
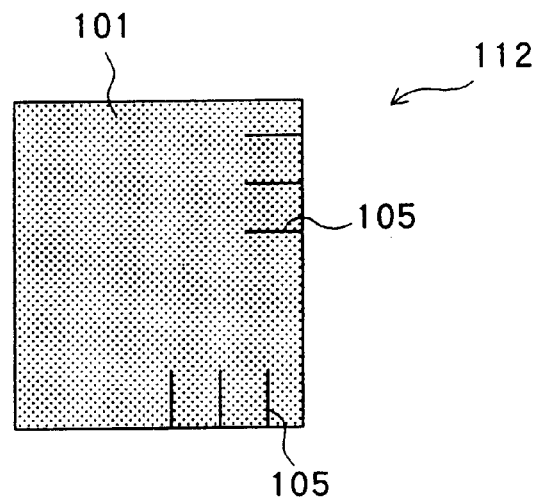

Furthermore, the foregoing embodiment has illustrated that first and second scribe lines 103, 104 are set in parallel only on one side of rectangular integrated circuits 101. Alternatively, as illustrated in FIG. 5, circuit chip 112 can also be implemented with first and second scribe lines 103, 104 set in parallel on the two sides of integrated circuit 101.

Figure 6A:
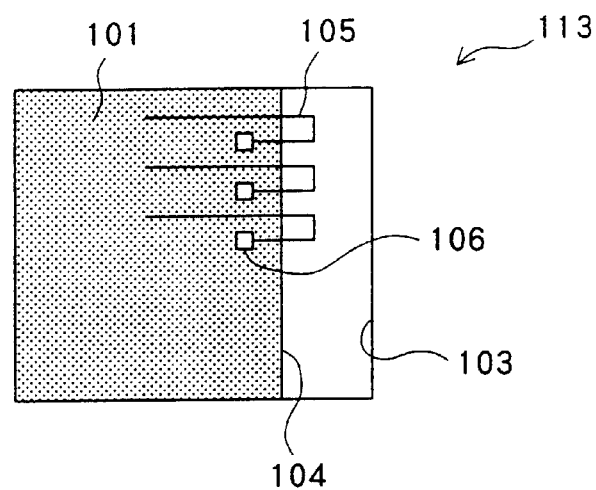
FIGS. 6a and 6b are top plan views illustrating a third exemplary modification.
Figure 6B:
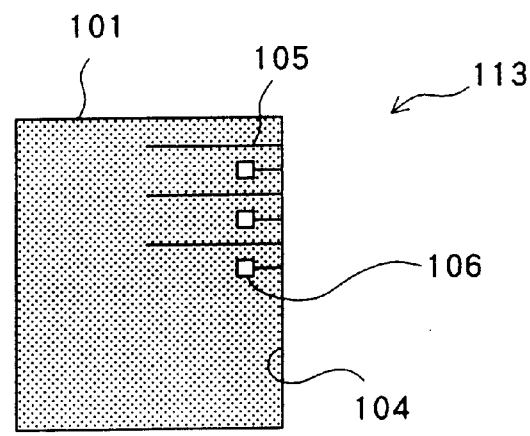

Also, the foregoing embodiment has illustrated that test pads 106 are formed in a gap between first and second scribe lines 103, 104. Alternatively, as illustrated in FIGS. 6a, 6b, circuit chip 113 can also be implemented with test pads 106 formed within integrated circuit 101, and test wirings 105 alone formed in a gap between first and second scribe lines 103, 104.

While an area of silicon wafer 100 to be wasted is increased because aforementioned circuit chip 110 requires a predetermined width of a gap between first and second scribe lines 103, 104 for forming test pads 106, finished integrated circuit 101 does not include test pads 106, so that integrated circuit 101 can be reduced in size.

On the other hand, while circuit chip 113 is made larger because test pads 106 remain on finished integrated circuit 101, it is possible to reduce a wasted area of silicon wafer 100 by reducing a gap between first and second scribe lines 103, 104 in which test wirings 105 alone are formed.

Stated another way, the foregoing circuit chips 110, 113 are advantageous and disadvantageous over each other, so that it is preferred that an optimal one is selected in consideration of a variety of conditions. For example, when integrated circuit 101 includes a dead space in which test pads 106 can be formed, a wasted area of silicon wafer 100 can be saved without increasing the size of circuit chip 113.

Figure 7A:
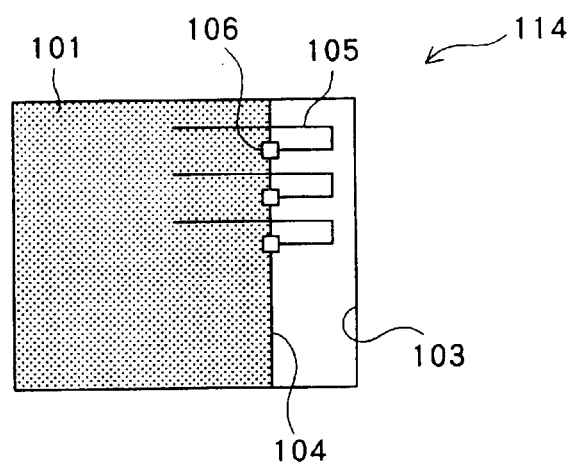
FIGS. 7a and 7b are top plan views illustrating a fourth exemplary modification.
Figure 7B:
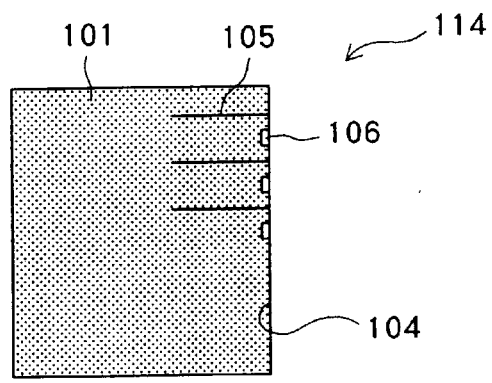

Also, as illustrated in FIGS. 7a, 7b, circuit chip 114 can be implemented with test wirings 105 formed in a gap between first and second scribe lines 103, 104, and test pads 106 formed along second scribe line 104.

In this modification, the gap between first and second scribe lines 103, 104 can be made smaller than the aforementioned circuit chip 110, and accordingly the area of integrated circuit 101 can be saved more than circuit chip 113.

While preferred embodiment of the present invention has been described using specific terms, such description is for illustrative purposes only, and it is to be understood that changes and variations may be made without departing from the spirit or scope of the following claims.

What is claimed is:

1. A chip manufacturing method for forming a number of substantially rectangular integrated circuits, each connected to at least one test pad through a test wiring, arranged through section lines on the surface of a circuit substrate, sectioning said circuit substrate along said section lines into said individual integrated circuits to form a number of circuit chips, and conducting a circuit test as required on at least some of said integrated circuits of a number of said circuit chips through said test pads, said method comprising the steps of:

setting a first and a second section lines in parallel to each other along at least one of four sides of each of said substantially rectangular integrated circuits arranged and formed on the surface of said circuit substrate;

forming said test pads and/or at least part of each of said test wirings in gaps between said first and second section lines;

conducting said circuit test after sectioning said circuit substrate along said first section line positioned outside; and cutting each said circuit chip along said second section line after conducting said circuit test to remove from each said circuit chip a portion thereof in which said test pad and/or at least the part of said test wiring are positioned.

2. The chip manufacturing method according to claim 1, wherein:

said test pad is positioned in a gap between said first and second section lines; and said test wiring connects said integrated circuit positioned inside said second section line to said test pad positioned outside said second section line.

3. The chip manufacturing method according to claim 1, wherein:

said test pad is formed within said integrated circuit positioned inside said second section line; and a portion of said test wiring is formed in the gap between said first and second section lines.

4. A chip manufacturing method for forming a number of substantially rectangular integrated circuits, each connected to at least one test pad through a test wiring, arranged through section lines on the surface of a circuit substrate, section said circuit substrate along said section lines into said individual integrated circuits to form a number of said circuit chips, and conducting a circuit test as required on at least some of said integrated circuits of a number of said circuit chips through said test pads, said method comprising the steps of:

setting a first and a second section lines in parallel to each other along at least one of four sides of each of said substantially rectangular integrated circuits arranged and formed on the surface of said circuit substrate;

forming said test pads and/or at least part of each of said test wirings in gaps between said first and second section lines;

sectioning from said circuit substrate along said first section line positioned outside, said integrated circuits of said circuit chips on which said circuit test is performed; and sectioning from said circuit substrate along said second section line positioned inside, said integrated circuits of said circuit chips on which said circuit test is not performed.

5. The chip manufacturing method according to claim 4, wherein:

said test pad is positioned in a gap between said first and second section lines; and said test wiring connects said integrated circuit positioned inside said second section line to said test pad positioned outside said second section line.

6. The chip manufacturing method according to claim 4, wherein:

said test pad is formed within said integrated circuit positioned inside said second section line; and a portion of said test wiring is formed in the gap between said first and second section lines.

7. A chip manufacturing method for forming a number of substantially rectangular integrated circuits, each connected to at least one test pad through a test wiring, arranged through section lines on the surface of a circuit substrate, conducting a circuit test on at least some of said integrated circuits formed on said circuit substrate through said test pads, and sectioning said circuit substrate along said section lines into said individual integrated circuits after said circuit test is completed to form a number of circuit chips, said method comprising the steps of:

setting a first and a second section lines in parallel to each other along at least one of four sides of each of said substantially rectangular integrated circuits arranged and formed on the surface of said circuit substrate;

forming said test pads and/or at least part of each of said test wirings in gaps between said first and second section lines; and sectioning said circuit substrate along at least said second section lines positioned inside after said circuit test is completed.

8. The chip manufacturing method according to claim 7, wherein:

said test pad is positioned in a gap between said first and second section lines; and said test wiring connects said integrated circuit positioned inside said second section line to said test pad positioned outside said second section line.

9. The chip manufacturing method according to claim 7, wherein:

said test pad is formed within said integrated circuit positioned inside said second section line; and a portion of said test wiring is formed in the gap between said first and second section lines.

* * * * *